United States Patent
Fujita

(10) Patent No.: US 10,868,531 B2
(45) Date of Patent: Dec. 15, 2020

(54) SIGNAL-MULTIPLEXING DEVICE

(71) Applicant: THINE ELECTRONICS, INC., Tokyo (JP)

(72) Inventor: Yusuke Fujita, Tokyo (JP)

(73) Assignee: THINE ELECTRONICS, INC., Tokyo (JP)

( * ) Notice: Subject to any disclaimer, the term of this patent is extended or adjusted under 35 U.S.C. 154(b) by 258 days.

(21) Appl. No.: 16/088,900

(22) PCT Filed: Mar. 7, 2017

(86) PCT No.: PCT/JP2017/008940
§ 371 (c)(1),
(2) Date: Sep. 27, 2018

(87) PCT Pub. No.: WO2017/169558
PCT Pub. Date: Oct. 5, 2017

(65) Prior Publication Data
US 2020/0328743 A1 Oct. 15, 2020

(30) Foreign Application Priority Data

Mar. 31, 2016 (JP) .................... 2016-070796

(51) Int. Cl.
H03K 17/693 (2006.01)
H03K 19/094 (2006.01)
H03K 19/20 (2006.01)

(52) U.S. Cl.
CPC ..... *H03K 17/693* (2013.01); *H03K 19/09425* (2013.01); *H03K 19/20* (2013.01)

(58) Field of Classification Search
None
See application file for complete search history.

(56) References Cited

U.S. PATENT DOCUMENTS 6,525,575 B2 * 2/2003 Hirobe ............... H03K 17/693
327/108
6,954,451 B1 10/2005 Jurasek et al.
(Continued)

FOREIGN PATENT DOCUMENTS

JP 51-99917 A 9/1976
JP 61-173519 A 8/1986
(Continued)

OTHER PUBLICATIONS

International Search Report in corresponding International Application No. PCT/JP2017/008940, dated May 30, 2017.
(Continued)

*Primary Examiner* — Jeffery S Zweizig
(74) *Attorney, Agent, or Firm* — Sughrue Mion, PLLC

(57) ABSTRACT

A signal-multiplexing device according to the present embodiment has a structure that is capable of satisfactorily handling an increase in a data rate. The signal-multiplexing device includes M pre-stage buffers and an output buffer. An m-th pre-stage buffer $B_m$ outputs an m-th input signal when the signal levels of both an m-th control signal $C_m$ and an n-th control signal $C_n$ of M control signals are significant, and the m-th pre-stage buffer $B_m$ enters into a high-impedance state when the signal level of at least one of the m-th control signal $C_m$ and the n-th control signal $C_n$ is non-significant. The output buffer $B_{out}$ sequentially outputs input signals that have been respectively outputted from the M pre-stage buffers at different timings.

15 Claims, 11 Drawing Sheets

(56) References Cited

U.S. PATENT DOCUMENTS

| | | | |
|---|---|---|---|
| 7,064,571 B2 * | 6/2006 | Namekawa | G11C 7/1012 |
| | | | 324/762.01 |
| 7,436,220 B2 * | 10/2008 | Anshumali | H03K 17/005 |
| | | | 326/113 |
| 2008/0258769 A1 | 10/2008 | Franger et al. | |
| 2017/0338813 A1 * | 11/2017 | Fujita | H03K 19/20 |

FOREIGN PATENT DOCUMENTS

| | | |
|---|---|---|
| JP | 2-141139 A | 5/1990 |
| JP | 3-102928 A | 4/1991 |
| JP | 4-353779 A | 12/1992 |
| JP | 5-503390 A | 6/1993 |
| JP | 6-216749 A | 8/1994 |
| JP | 6-311020 A | 11/1994 |
| WO | 92/08230 A1 | 5/1992 |

OTHER PUBLICATIONS

International Preliminary Report on Patentability with a Translation of Written Opinion in counterpart International Application No. PCT/JP2017/008940, dated Oct. 11, 2018.

Kim, et al., "A 16-to-40Gb/s Quarter-Rate Nrz/PAM4 Dual-Mode Transmitter in 14nm CMOS", IEEE International Solid-State Circuits Conference, Feb. 23, 2015, pp. 60-62 (2 pages total).

* cited by examiner

Fig. 2

| CONTROL SIGNAL | | | | | OUTPUT SIGNAL OF PRE-STAGE BUFFER | | | | OUTPUT SIGNAL OF OUTPUT BUFFER |
|---|---|---|---|---|---|---|---|---|---|
| $C_1$ | $C_2$ | $C_3$ | ... | $C_M$ | $B_1$ | $B_2$ | ... | $B_M$ | $B_{out}$ |
| 1 | 1 | 0 | ... | 0 | $I_1$ | Hi-Z | ... | Hi-Z | $I_1$ |
| 0 | 1 | 1 | ... | 0 | Hi-Z | $I_2$ | ... | Hi-Z | $I_2$ |
| ... | ... | ... | ... | ... | ... | ... | ... | ... | ... |
| 1 | 0 | 0 | ... | 1 | Hi-Z | Hi-Z | ... | $I_M$ | $I_M$ |

SIGNAL-MULTIPLEXING DEVICE

CROSS REFERENCE TO RELATED APPLICATIONS

This application is a National Stage of International Application No. PCT/JP2017/008940 filed Mar. 7, 2017, claiming priority based on Japanese Patent Application No. 2016-070796 filed Mar. 31, 2016.

TECHNICAL FIELD

The present invention relates to a signal-multiplexing device.

BACKGROUND ART

Non-Patent Document 1 describes a signal-multiplexing device that multiplexes four input signals so as to generate a single output signal. This signal-multiplexing device includes four buffers that are connected in parallel. Each of the buffers includes a flip-flop and two transfer gates that are connected in series in order. Each of the transfer gates is adjusted so as to enter into the ON state at a prescribed timing. By doing this, input signals that have been inputted to the respective buffers are sequentially output as a single output signal from the signal-multiplexing device.

The signal-multiplexing device described in Non-Patent Document 1 is capable of widening an allowable range of a delay time of the flip-flop and handling, an increase in a date rate in comparison with a case where two input signals are multiplexed such that a single output signal is generated.

CITATION LIST

Non-Patent Literature

Non-Patent Document 1: Jihwan Kim et al., "A 16-to-40 Gb/s Quarter-Rate NRZ/PAM4 Dual-Model Transmitter in 14 nm CMOS", 2015 IEEE International Solid-State Circuits Conference (ISSCC), (US), February 2015

SUMMARY OF INVENTION

Technical Problem

Inventors studied a conventional signal-multiplexing device so as to discover the problem below. That is, in the signal-multiplexing device described in Non-Patent Document 1 listed above, a parasitic resistance value and a parasitic capacitance value increase due to the serial connection of two transfer gates. Therefore, the waveform of an output signal is blunted, and a frequency band is limited. Accordingly, there is a problem that the signal-multiplexing device described in Non-Patent Document 1 listed above fails to satisfactorily handle an increase in a data rate.

An object of the present invention is to provide a signal-multiplexing device having a structure that is capable of satisfactorily handling an increase in a data rate.

Solution to Problem

In order to solve the problem above, a signal-multiplexing device according to the present embodiment outputs an input signal $I_m$ of M input signals $I_1$ to $I_M$ (M is an integer of 3 or more) during a prescribed period. The input signal $I_m$ is sequentially specified by a combination of the signal levels of at least an m-th control signal $C_m$ (in is an integer that is greater than or equal to 1 and is smaller than or equal to M) and an n-th control signal $C_n$ (n is 1 when m=M, and n is an integer of m+1 when m<M) that are selected from M control signals $C_1$ to $C_M$. The prescribed period is a period during which the combination of the signal levels is maintained. Specifically, the signal-multiplexing device includes M pre-stage buffers $B_1$ to $B_M$ that are provided so as to respectively correspond to the input signals $I_1$ to $I_M$, and an output buffer $B_{out}$ that is electrically connected to an output end of each of the pre-stage buffers $B_1$ to $B_M$. An m-th pre-stage buffer $B_m$ of the pre-stage buffers $B_1$ to $B_M$ includes an input end that captures the input signal $I_m$, an input end that captures the control signal $C_m$, an input end that captures the control signal $C_n$, and an output end that outputs the input signal $I_m$. The pre-stage buffer $B_m$ outputs the input signal $I_m$ that has been inputted to the pre-stage buffer $B_m$, when the signal levels of both the control signal $C_m$ and the control signal $C_n$ are significant. On the other hand, the pre-stage buffer $B_m$ enters into a high-impedance output state, when the signal level of at least one of the control signal $C_m$ and the control signal $C_n$ is non-significant. The output buffer $B_{out}$ sequentially outputs the input signals $I_1$ to $I_M$ that have been respectively outputted from the pre-stage buffers $B_1$ to $B_M$ at different timings.

Advantageous Effects of Invention

The signal-multiplexing device according to the present embodiment is capable of satisfactorily handling an increase in a data rate.

BRIEF DESCRIPTION OF DRAWINGS

FIG. 2 is a table that collectively illustrates relationships among the respective levels of control signals $C_1$ to $C_M$, the respective output signals of pre-stage buffers $B_1$ to $B_m$, and the output signal of an output buffer $B_{out}$ in the signal-multiplexing device 1 according to the present embodiment.

DESCRIPTION OF EMBODIMENTS

Figure 1:
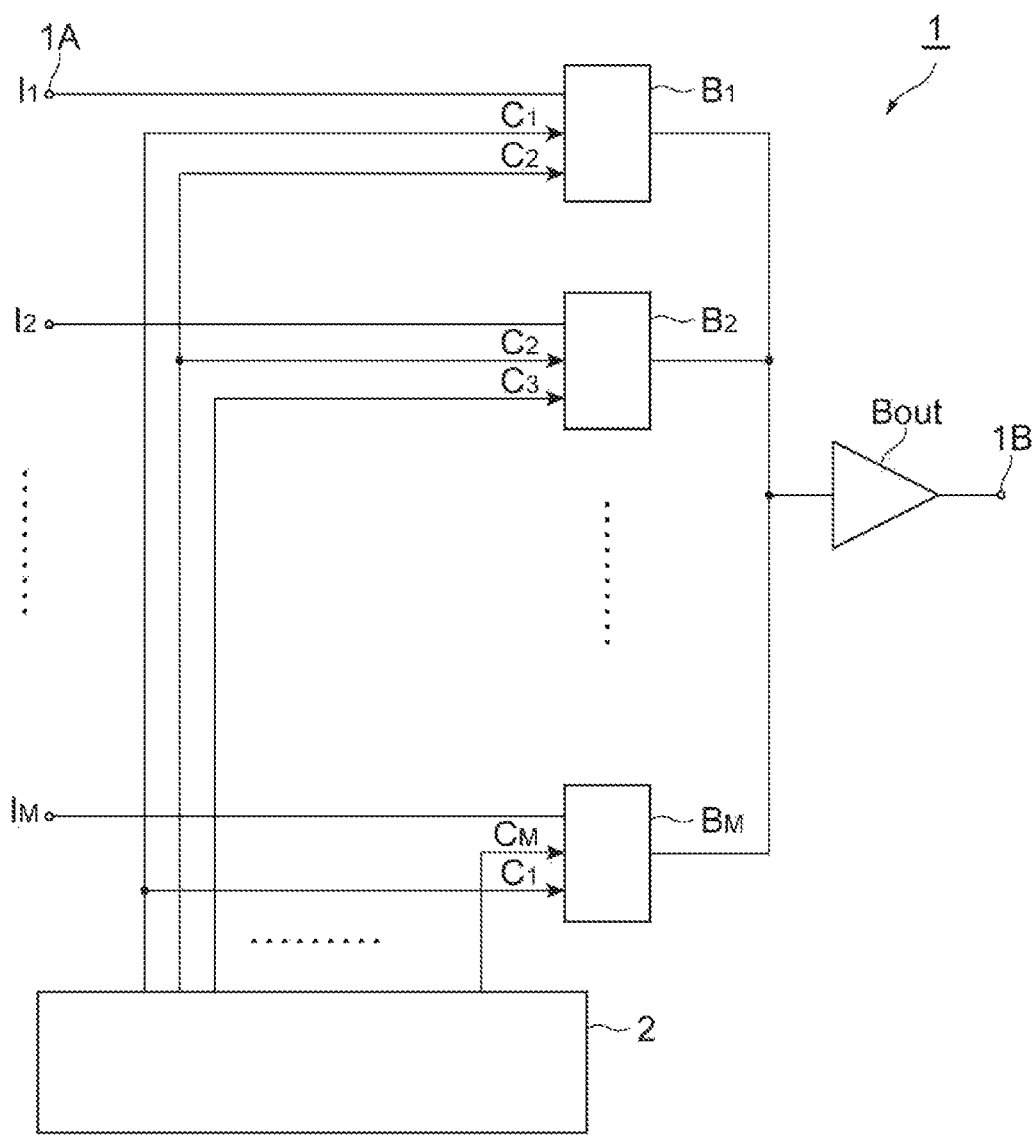
FIG. 1 illustrates a configuration of a signal-multiplexing device 1 according to the present embodiment.

Description of Embodiment of the Present Invention

First, the contents of an embodiment of the present invention are individually described.

(1) A signal-multiplexing device according to the present embodiment outputs an input signal $I_m$ of M input signals $I_1$ to $I_M$ (M is an integer of 3 or more) during a prescribed period. The input signal $I_m$ is sequentially specified by a combination of the signal levels of at least an m-th control signal $C_m$ (m is an integer that is greater than or equal to 1 and is smaller than or equal to M) and an n-th control signal $C_n$ (n is 1 when m=M, and n is an integer of m+1 when m<M) that are selected from M control signals $C_1$ to $C_M$. The prescribed period is a period during which the combination of the signal levels is maintained. In one aspect, the signal-multiplexing device includes M pre-stage buffers $B_1$ to $B_M$ that are provided so as to respectively correspond to the input signals $I_1$ to $I_M$, and an output buffer $B_{out}$ that is electrically connected to an output end of each of the pre-stage buffers $B_1$ to $B_M$. An m-th pre-stage buffer $B_m$ of the pre-stage buffers $B_1$ to $B_M$ includes an input end that captures the input signal $I_m$, an input end that captures the control signal $C_m$ an input end that captures the control signal $C_n$, and an output end that outputs the input signal $I_m$. The pre-stage buffer $B_m$ outputs the input signal $I_m$ that has been inputted to the pre-stage buffer $B_m$, when the signal levels of both the control signal $C_m$ and the control signal $C_n$ are significant. On the other hand, the pre-stage buffer $B_m$ enters into a high-impedance output state, when the signal level of at least one of the control signal $C_m$ and the control signal $C_n$ is non-significant. The output buffer $B_{out}$ sequentially outputs the input signals $I_1$ to $I_M$ that have been respectively outputted from the pre-stage buffers $B_1$ to $B_M$ at different timings.

(2) In one aspect of the present embodiment, various configurations can be applied to the pre-stage buffer $B_m$. Specifically, a first exemplary configuration of the pre-stage buffer $B_m$ includes a tri-state buffer and a switch. The tri-state buffer is a circuit for which an output signal level is set to each of the output states "High", "Low", and "High-impedance". Specifically, when the signal level of the control signal $C_m$ is significant, the tri-state buffer outputs a temporarily captured input signal (for example, a binary signal that is configured by two states, "High" and "Low") $I_m$. When the signal level of the control signal $C_m$ is non-significant, the tri-state buffer enters into the high-impedance output state (a state in which the tri-state buffer and the switch are substantially disconnected). The switch includes a first end that is electrically connected to an output end of the tri-state buffer, and a second end that is electrically connected to an input end of the output buffer $B_{out}$. In this configuration, the switch changes a state of electrical connection between the first end and the second end in accordance with the signal level of the control signal $C_n$. Specifically, when the signal level of the control signal $C_n$ is significant, the switch electrically connects the first end and the second end (the ON state). When the signal level of the control signal $C_n$ is non-significant, the switch electrically disconnects the first end and the second end (the OFF state).

(3) In one aspect of the present embodiment, the tri-state buffer may include a first gate circuit, a second gate circuit, and a first-configuration series circuit that is disposed between a first reference end and a second reference end. The first reference end is set to have a first reference potential, and a second reference end is set to have a second reference potential that is lower than the first reference potential. The first-configuration series circuit is configured by a PMOS transistor and an NMOS transistor that are disposed in order from a side of the first reference end to a side of the second reference end, and a drain of the PMOS transistor and a drain of the NMOS transistor are connected to each other. The first gate circuit outputs a signal indicating a negative AND (NAND) of the input signal $I_m$ and the control signal $C_m$. The second gate circuit outputs a signal indicating a negative OR (NOR) of the input signal $I_m$ and a logic inversion signal of the control signal $C_m$. The PMOS transistor includes a source that is electrically connected to the first reference end, a gate that is connected to an output end of the first gate circuit, and the drain that is electrically connected to the drain of the NMOS transistor. The NMOS transistor includes the drain that is electrically connected to the drain of the PMOS transistor, a gate that is electrically connected to an output end of the second gate circuit, and a source that is electrically connected to the second reference end. Further, a connection point of the drain of the PMOS transistor and the drain of the NMOS transistor is electrically connected to the switch.

(4) In one aspect of the present embodiment, a second exemplary configuration of the pre-stage buffer $B_m$ may include a first gate circuit, a second gate circuit, and a second-configuration series circuit that is disposed between the first reference end and the second reference end. The second-configuration series circuit is configured by a first buffer switch, a PMOS transistor, an NMOS transistor, and a second buffer switch that are disposed in order from a side of the first reference end to a side of the second reference end. The first gate circuit outputs a signal indicating an NAND of the input signal $I_m$ and the control signal $C_m$. The second gate circuit outputs a signal indicating an NOR of the input signal $I_m$ and a logic inversion signal of the control signal $C_m$. The first buffer switch includes a first end that is electrically connected to the first reference end, and a second end that is electrically connected to a source of the PMOS transistor. In addition, the first buffer switch changes a state of electrical connection between the first end and the second end of the first buffer switch in accordance with the signal level of the control signal $C_n$. Stated another way, when the signal level of the control signal $C_n$ is significant, the first buffer switch electrically connects the first end and the second end (the ON state). When the signal level of the control signal $C_n$ is non-significant, the first buffer switch electrically disconnects the first end and the second end (the OFF state). The PMOS transistor includes a source that is electrically connected to the second end of the first buffer switch, a gate that is connected to an output end of the first gate circuit, and a drain that is electrically connected to a drain of the NMOS transistor. The NMOS transistor includes the drain that is connected to the drain of the PMOS transistor, a gate that is electrically connected to an output end of the second gate circuit, and a source that is electrically connected to a first end of the second buffer switch. The second buffer switch includes a first end that is electrically connected to the source of the NMOS transistor, and a second end that is electrically connected to the second reference end. In addition, the second buffer switch changes a state of electrical connection between the first end and the second end of the second buffer switch in accordance with the signal level of the control signal $C_n$. Stated another way, when the signal level of the control signal $C_n$ is significant, the second buffer switch electrically connects the first end and the second end (the ON state). When the signal level of the control signal $C_n$ is non-significant, the second buffer switch electrically disconnects the first end and the second end (the OFF state). Further, a connection point of the drain of the PMOS transistor and the drain of the NMOS transistor is connected to the input end of the output buffer $B_{out}$.

(5) In one aspect of the present embodiment, a third exemplary configuration of the pre-stage buffer $B_m$ may include a first gate circuit, a second gate circuit, and a third-configuration series circuit that is disposed between the first reference end and the second reference end. The third-configuration series circuit is configured by a PMOS transistor, a first buffer switch, a second buffer switch, and an NMOS transistor that are disposed in order from a side of the first reference end to a side of the second reference end. The first gate circuit outputs a signal indicating an NAND of the input signal $I_m$ and the control signal $C_m$. The second gate circuit outputs a signal indicating an NOR of the input signal $I_m$ and a logic inversion signal of the control signal $C_m$. The PMOS transistor includes a source that is electrically connected to the first reference end, a gate that is electrically connected to an output end of the first gate circuit, and a drain that is electrically connected to a first end of the first buffer switch. The first buffer switch includes a first end that is electrically connected to the drain of the PMOS transistor, and a second end that is electrically connected to a first end of the second buffer switch. In addition, the first buffer switch changes a state of electrical connection between the first end and the second end of the first buffer switch in accordance with the signal level of the control signal $C_n$. Specifically, when the signal level of the control signal $C_n$ is significant, the first buffer switch electrically connects the first end and the second end (the ON state). When the signal level of the control signal $C_n$ is non-significant, the first buffer switch electrically disconnects the first end and the second end (the OFF state). The second buffer switch includes a first end that is electrically connected to the second end of the first buffer switch, and a second end that is electrically connected to a drain of the NMOS transistor. In addition, the second buffer switch changes a state of electrical connection between the first end and the second end of the second buffer switch in accordance with the signal level of the control signal $C_n$. Specifically, when the signal level of the control signal $C_n$ is significant, the second buffer switch electrically connects the first end and the second end (the ON state). When the signal level of the control signal $C_n$ is non-significant, the second buffer switch electrically disconnects the first end and the second end (the OFF state). The NMOS transistor includes the drain that is electrically connected to the second end of the second buffer switch, a gate that is electrically connected to an output end of the second gate circuit, and a source that is electrically connected to the second reference end. Further, a connection point of the second end of the first buffer switch and the first end of the second buffer switch is electrically connected to the input end of the output buffer $B_{out}$.

(6) In one aspect of the present embodiment, the third exemplary configuration of the pre-stage buffer $B_m$ may further include a first refresh circuit that refreshes a potential at a connection point of the drain of the PMOS transistor and the first end of the first buffer switch, and a second refresh circuit that refreshes a potential at a connection point of the drain of the NMOS transistor and the second end of the second buffer switch. In this case, the first refresh circuit includes a first end that is electrically connected to a third reference end, and a second end that is electrically connected to the connection point of the drain of the PMOS transistor and the first end of the first buffer switch. The third reference end is set to have a third reference potential that is higher than the second reference potential. The second refresh circuit includes a first end that is electrically connected to the connection point of the drain of the NMOS transistor and the second end of the second buffer switch, and a second end that is electrically connected to a fourth reference end. The fourth reference end is set to have a fourth reference potential that is lower than the first reference potential.

(7) In one aspect of the present embodiment, a fourth exemplary configuration of the pre-stage buffer $B_m$ may include a first gate circuit, a second gate circuit, a three gate circuit, a fourth gate circuit, and a fourth-configuration series circuit that is disposed between the first reference end and the second reference end. The fourth-configuration series circuit is configured by a PMOS transistor and an NMOS transistor that are disposed in order from a side of the first reference end to a side of the second reference end, and a drain of the PMOS transistor and a drain of the NMOS transistor are connected to each other. The first gate circuit outputs a signal indicating an NOR of the input signal $I_m$ and a logic inversion signal of the control signal $C_m$. The second gate circuit outputs a signal indicating an NAND of an output signal of the first gate circuit and the control signal $C_n$. The third gate circuit outputs a signal indicating an NAND of the input signal $I_m$ and the control signal $C_m$. The fourth gate circuit outputs a signal indicating an NOR of an output signal of the third gate circuit and a logic inversion signal of the control signal $C_n$. The PMOS transistor includes a source that is electrically connected to the first reference end, a gate that is connected to an output end of the second gate circuit, and the drain that is electrically connected to the drain of the NMOS transistor. The NMOS transistor includes the drain that is electrically connected to the drain of the PMOS transistor, a gate that is electrically connected to an output end of the fourth gate circuit, and a source that is electrically connected to the second reference end.

(8) In one aspect of the present embodiment, the signal-multiplexing device that has various structures described above may further include a generator that generates each of the control signals $C_1$ to $C_M$ (a control signal generator). When M=6, namely, when the generator generates control signals $C_1$ to $C_6$ that correspond to the control signals $C_1$ to $C_M$, it is preferable that the generator include first to fifth latch circuits and fifth to eighth gate circuits. In this configuration, the first latch circuit receives an output signal of the seventh gate circuit, latches a value of the output signal of the seventh gate circuit at one timing of a rising timing and a falling timing of a clock, and outputs the latched value. The fifth gate circuit outputs a logic inversion signal of an output signal of the first latch circuit as the control signal $C_3$. The second latch circuit receives the control signal $C_3$, latches a value of the control signal $C_3$ at the other timing of the rising timing or the falling timing of the clock, and outputs the latched value as the control signal $C_4$. The third latch circuit receives the output signal of the first latch circuit, latches a value of the output signal of the first latch circuit at the one timing described above, and outputs the latched value. The sixth gate circuit outputs a logic inversion signal of an output signal of the third latch circuit as the control signal $C_5$. The fourth latch circuit latches a value of the control signal $C_5$ outputted from the sixth gate circuit at the other timing described above, and outputs the latched value as the control signal $C_6$. The seventh gate circuit outputs a signal indicating an NAND of the output signal of the first latch circuit and the output signal of the third latch. The eighth gate circuit outputs a logic inversion signal of an output signal of the seventh gate circuit as the control signal $C_1$. The fifth latch circuit latches a value of the control signal $C_1$ outputted from the eighth gate circuit at the other timing described above, and outputs the latched value as the control signal $C_2$.

Each of the aspects described in the Description of Embodiment of the Present Invention can be applied to each of the other aspects or a combination of the other aspects.

DETAILS OF EMBODIMENT OF THE PRESENT INVENTION

Specific structures of the signal-multiplexing device according to the present embodiment are described below in detail with reference to the appended drawings. The present invention is not limited to these illustrations. The present invention is described in the claims, and is intended to include equivalents of the claims and all changes without departing from the scope of the claims. In the description of the drawings, the same components are denoted by the same reference signs, and duplicate description is omitted.

FIG. 1 illustrates the configuration of a signal-multiplexing device 1 according to the present embodiment. The signal-multiplexing device 1 illustrated in FIG. 1 outputs a signal that corresponds to any input signal of M input signals $I_1$ to $I_M$ (M is an integer of 3 or more) (substantially, an input signal) in accordance with the level of each of M control signals $C_1$ to $C_M$. Stated another way, the signal-multiplexing device 1 is a device that multiplexes the input signals $I_1$ to $I_M$ each having been captured from an input end 1A and outputs an output signal (a multiplexed output signal) from a single output end 1B. The signal-multiplexing device 1 includes M pre-stage buffers $B_1$ to $B_M$, an output buffer $B_{out}$, and a generator 2 that generates each of the control signals $C_1$ to $C_M$. As an example of signal-multiplexing, an input signal $I_m$ of the input signals $I_1$ to $I_M$ is output during a prescribed period. The input signal $I_m$ is sequentially specified by a combination of the signal levels of at least an m-th control signal $C_m$ (m is an integer that is greater than or equal to 1 and is smaller than or equal to M) and an n-th control signal $C_n$ (n is 1 when m=M, and n is an integer of m+1 when m<M) that are selected from the control signals $C_1$ to $C_M$. The prescribed period is a period during which the combination of the signal levels of the control signal $C_m$ and the control signal $C_n$ is maintained.

As described above, an m-th pre-stage buffer $B_m$ of the pre-stage buffers $B_1$ to $B_M$ receives an m-th input signal $I_m$ of the input signals $I_1$ to $I_M$ captured in the signal-multiplexing device 1 via input ends $I_1$ to $I_M$, and the control signal $C_m$ and the control signal $C_n$ of the control signals $C_1$ to $C_M$. The pre-stage buffer $B_m$ outputs a signal that corresponds to the input signal $I_m$ (substantially, the input signal $I_m$), when the signal levels of both the control signal $C_m$ and the control signal $C_n$ are significant. The pre-stage buffer $B_m$ enters into a high-impedance output state (a substantially disconnection state), when the signal level of at least one of the control signal $C_m$ and the control signal $C_n$ is non-significant.

The output buffer $B_{out}$ is connected to respective output ends of the pre-stage buffers $B_1$ to $B_M$. Stated another way, the pre-stage buffers $B_1$ to $B_M$ are connected in parallel to each other. The output buffer $B_{out}$ receives respective signals outputted from the pre-stage buffers $B_1$ to $B_M$, at different timings, and outputs a signal that corresponds to a received signal (substantially, the input signal $I_m$ specified by the combination of the signal levels of the control signal $C_m$ and the control signal $C_n$).

FIG. 2 is a table that collectively illustrates relationships among the respective signal levels of the control signals $C_1$ to $C_M$, the respective output signals of the pre-stage buffers $B_1$ to $B_M$, and the output signal of the output buffer $B_{out}$ in the signal-multiplexing device 1 according to the present embodiment. In the table of FIG. 2, as the signal level of a control signal, a significant level (a High level) is indicated by "1", and a non-significant level (a Low level) is indicated by "0". The high-impedance output state of a pre-stage buffer is indicated by "Hi-Z".

Figure 3:
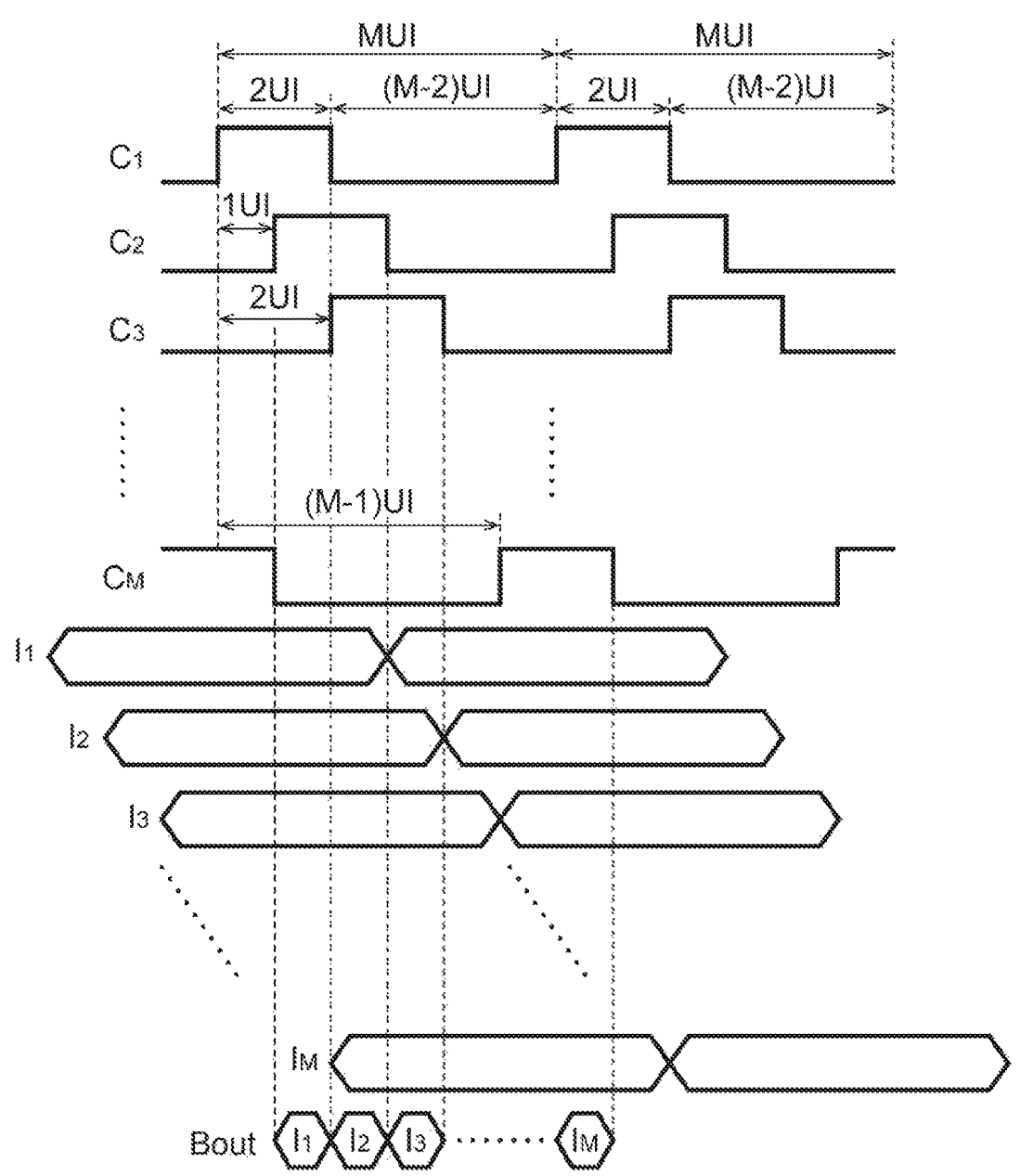
FIG. 3 is a timing chart illustrating each of the control signals C to $C_M$, input signals $I_1$ to $I_M$, and the output signal of the output buffer $B_{out}$.

FIG. 3 is a timing chart illustrating the control signals $C_1$ to $C_M$, the input signals $I_1$ to $I_M$, and the output signal (a multiplexed signal) of the output buffer $B_{out}$. As illustrated in FIG. 3, the control signals $C_1$ to $C_M$ are signals for which one cycle is MUI (a unit interval). Each of the control signals $C_1$ to $C_M$ is a signal in which a significant level (a High level) of 2 UI and a non-significant level (a Low level) of (M−2)UI are repeated. The control signal $C_m$ is a signal that is delayed by (m−1)UI with respect to the control signal $C_1$. The unit interval is the unit length of an output signal of the signal-multiplexing device 1. For example, when the data rate of an output signal is 40 Gb/s, UI is 25 ps.

Exemplary configurations of the generator 2 are described next.

Figure 4:
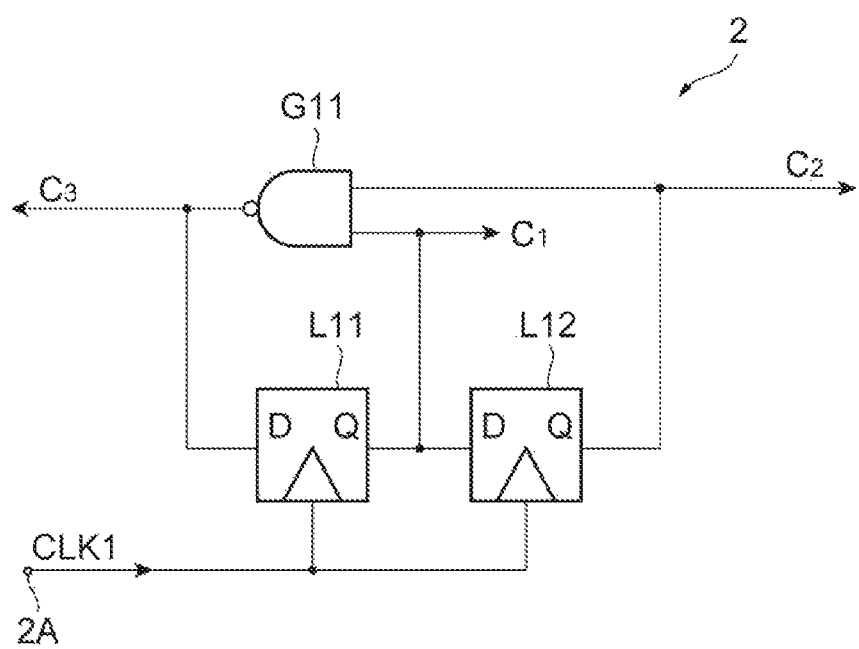
FIG. 4 illustrates an exemplary configuration of a generator 2 that generates M (=3) control signals.

FIG. 4 illustrates an exemplary configuration of a generator 2 that generates control signals $C_1$ to $C_3$ (M=3). As illustrated in FIG. 4, a generator 2 at the time when M=3 includes a latch circuit L11, a latch circuit L12, and a gate circuit GI. The latch circuit L11 and the latch circuit L12 are configured, for example, by a D flip-flop circuit.

The latch circuit L11 receives a clock CLK1 captured from an input end 2A and an output signal of the gate circuit G11, and latches a value of the output signal of the gate circuit G11 at a rising timing of the clock CLK1. The latched value is output as a control signal $C_1$ from the latch circuit 11. The latch circuit L12 receives the clock CLK1 and the control signal $C_1$ serving as an output signal of the latch circuit L11, and latches a value of the control signal $C_1$ at a rising timing of the clock CLK1. The latched value is output as the control signal $C_2$ from the latch circuit L12.

The gate circuit G11 receives the control signal $C_1$ serving as the output signal of the latch circuit L11, and the control signal $C_2$ serving as an output signal of the latch circuit L12, and outputs a signal indicating an NAND of these signals as the control signal $C_3$. Stated another way, the latch circuit L11 receives the control signal $C_3$ as the output signal of the gate circuit G11.

By employing the generator 2 at the time when M=3 that is configured as described above, each of the control signals $C_1$ to $C_3$ can be generated in which a significant level of 2 UI and a non-significant level of 1 UI are repeated.

In a configuration at the time when M=4, control signals $C_1$ to $C_4$ (M=4) are signals in which a significant level of 2 UI and a non-significant level of 2 UI are repeated, and are signals in which a period of the significant level is equal to a period of the non-significant level. Accordingly, the control signal $C_1$ and the control signal $C_3$ have a logic inversion relationship, and the control signal $C_2$ and the control signal $C_4$ also have the logic inversion relationship. Therefore, a generator 2 at the time when M=4 can generate each of the control signals $C_1$ to $C_4$, for example, by including a delay circuit that delays a clock and a logic inversion circuit that inverts logic.

Figure 5:
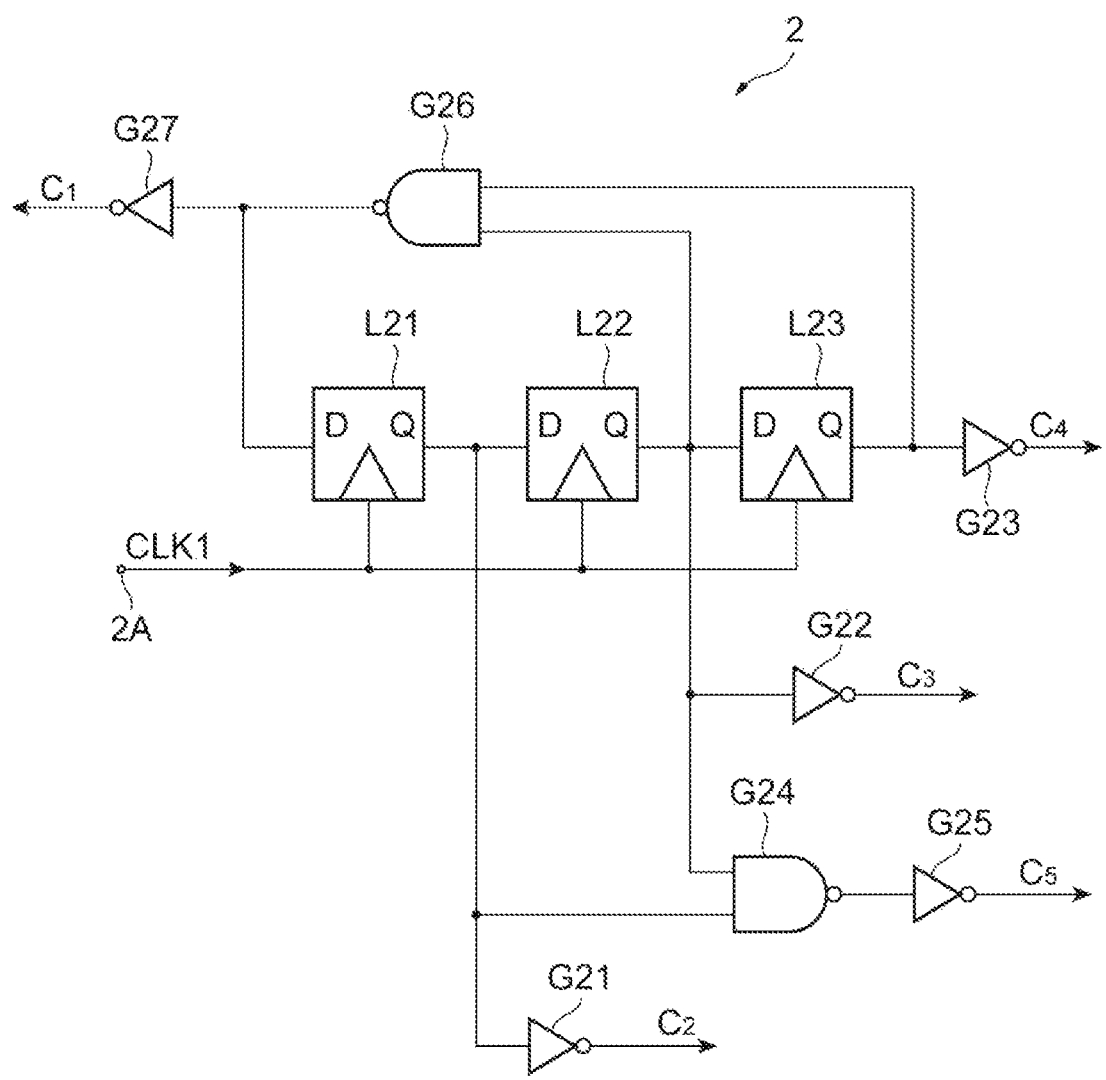
FIG. 5 illustrates an exemplary configuration of a generator 2 that generates M (=5) control signals.

FIG. 5 illustrates an exemplary configuration of a generator 2 that generates control signals $C_1$ to $C_5$ (M=5). As illustrated in FIG. 5, a generator 2 at the time when M=5 includes latch circuits L21 to L23 and gate circuits G21 to G27. The latch circuits L21 to L23 are configured, for example, by a D flip-flop circuit.

The latch circuit L21 receives a clock CLK1 captured from an input end 2A and an output signal of the gate circuit G26, and latches a value of the output signal of the gate circuit G26 at a rising timing of the clock CLK1. The latched value is outputted from the latch circuit L21. The gate circuit G21 receives an output signal of the latch circuit L21, and outputs a logic inversion signal of this signal as the control signal $C_2$.

The latch circuit L22 receives the clock CLK1 and an output signal of the latch circuit L21, and latches a value of the output signal of the latch circuit L21 at a rising timing of the clock CLK1. The latched value is outputted from the latch circuit L22. The gate circuit G22 receives an output signal of the latch circuit L22, and outputs a logic inversion signal of this signal as the control signal $C_3$.

The latch circuit L23 receives the clock CLK1 and an output signal of the latch circuit L22, and latches a value of the output signal of the latch circuit L22 at a rising timing of the clock CLK1. The latched value is outputted from the latch circuit L23. The gate circuit G23 receives an output signal of the latch circuit L23, and outputs a logic inversion signal of this signal as the control signal $C_4$.

The gate circuit G24 receives the output signal of the latch circuit L21 and the output signal of the latch circuit L22, and outputs a signal indicating an NAND of these signals. The gate circuit G25 receives an output signal of the gate circuit G24, and outputs a logic inversion signal of this signal as the control signal $C_5$. The gate circuit G26 receives the output signal of the latch circuit L22 and the output signal of the latch circuit L23, and outputs a signal indicating an NAND of these signals. The gate circuit G27 receives an output signal of the gate circuit G26, and outputs a logic inversion signal of this signal as the control signal $C_1$.

By employing the generator 2 at the time when M=5 that is configured as described above, each of the control signals $C_1$ to $C_5$ can be generated in which a significant level of 2 UI and a non-significant level of 3 UI are repeated.

Figure 6:
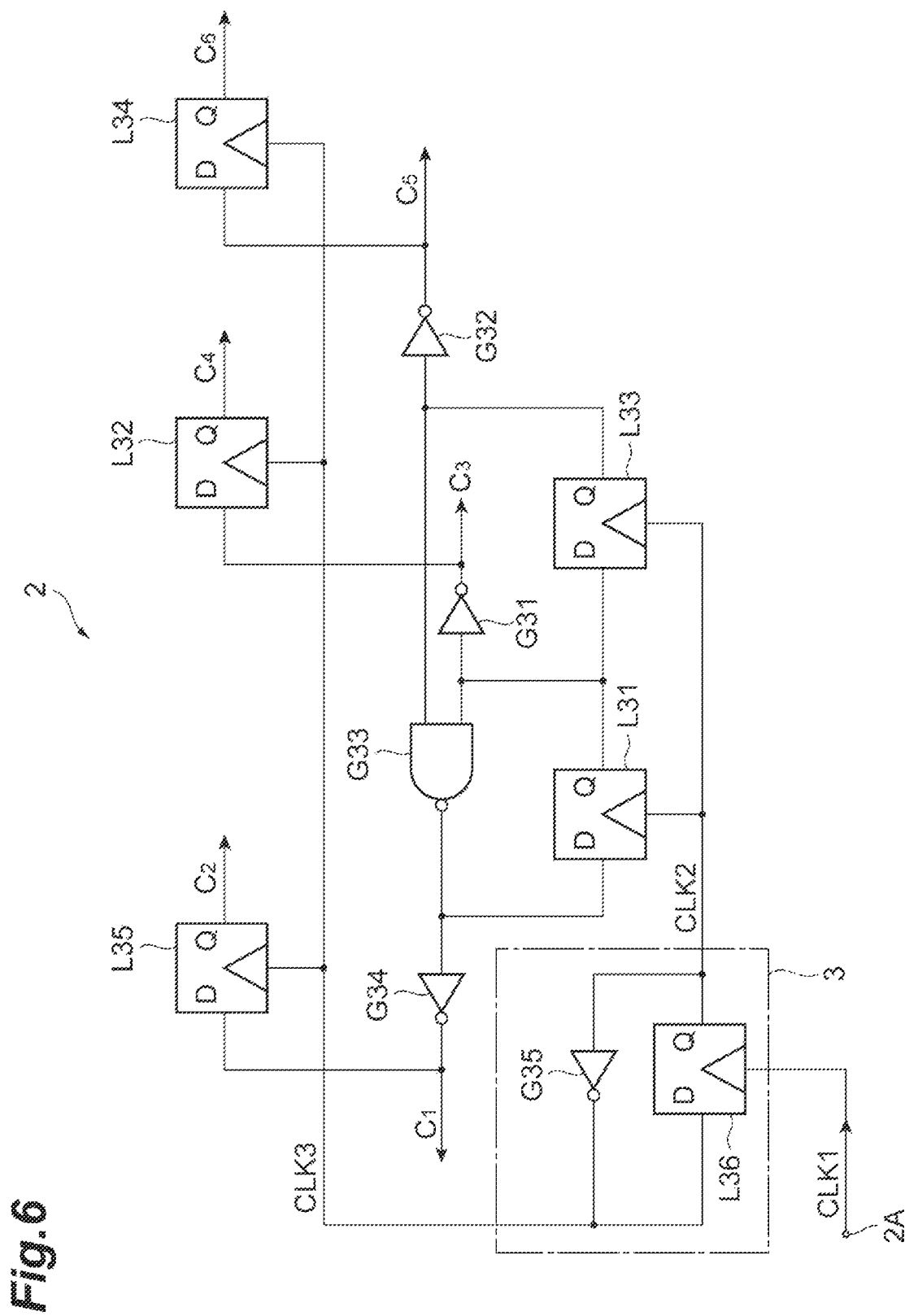
FIG. 6 illustrates an exemplary configuration of a generator 2 that generates M (=6) control signals.

FIG. 6 illustrates an exemplary configuration of a generator 2 that generates control signals $C_1$ to $C_6$ (M=6). As illustrated in FIG. 6, a generator 2 at the time when M=6 includes a 2-division circuit 3, latch circuits L31 to L35, and gate circuits G31 to G34. The 2-division circuit 3 includes a latch circuit L36 and a gate circuit G35. The latch circuits L31 to L36 are configured, for example, by a D flip-flop circuit.

The latch circuit L36 receives a clock CLK1 captured from an input end 2A and an output signal of the gate circuit G35, and latches a value of the output signal of the gate circuit G35 at a rising timing of the clock CLK1. The latched value is output as a clock CLK2 from the latch circuit L36. The clock CLK2 is a 2-divided signal obtained by 2-dividing the clock CLK1. The gate circuit G35 receives the clock CLK2 serving as an output signal of the latch circuit L36, and outputs a clock CLK3 as a logic inversion signal of the clock CLK2. By employing the 2-division circuit 3 configured as described above, the clock CLK2 and the clock CLK3 are generated from the clock CLK1.

The latch circuit L31 receives the clock CLK2 and an output signal of the gate circuit G33, and latches a value of the output signal of the gate circuit G33 at a rising timing of the clock CLK2. The latched value is outputted from the latch circuit L31. The gate circuit G31 receives an output signal of the latch circuit L31, and outputs a logic inversion signal of this signal as the control signal $C_3$.

The latch circuit L32 receives the clock CLK3 and the control signal $C_3$ serving as an output signal of the gate circuit G31, and latches a value of the control signal $C_3$ at a rising timing of the clock CLK3. The latched value is output as the control signal $C_4$ from the latch circuit L32. The latch circuit L33 receives the clock CLK2 and the output signal of the latch circuit L31, and latches a value of the output signal of the latch circuit L31 at a rising timing of the clock CLK2. The latched value is outputted.

The gate circuit G32 receives an output signal of the latch circuit L33, and outputs a logic inversion signal of this signal as the control signal $C_5$. The latch circuit L34 receives the clock CLK3 and the control signal $C_5$ serving as an output signal of the gate circuit G32, and latches a value of the control signal $C_5$ at a rising timing of the clock CLK3. The latched value is output as the control signal $C_6$ from the latch circuit L34. The gate circuit G33 receives the output signal of the latch circuit L31 and the output signal of the latch circuit L33, and outputs a signal indicating an NAND of these signals.

The gate circuit G34 receives an output signal of the gate circuit G33, and outputs a logic inversion signal of this signal as the control signal $C_1$. The latch circuit L35 receives the clock CLK3 and the control signal C serving as an output signal of the gate circuit G34, and latches a value of the control signal $C_1$ at a rising timing of the clock CLK3. The latched value is output as the control signal $C_2$ from the latch circuit L35.

By employing the generator 2 at the time when M=6 that is configured as described above, each of the control signals $C_1$ to $C_6$ can be generated in which a significant level of 2 UI and a non-significant level of 4 UI are repeated.

The control signals $C_1$ to $C_M$ are equivalent to M-phase clocks for which a duty ratio is 2/M and a phase is shifted by $2\pi/M$. Therefore, in the generator 2, any of signals output as the control signals $C_1$ to $C_M$ may be set as the control signal $C_1$, and the control signals $C_2$ to $C_M$ may be selected so as to be signals that are delayed by 1 UI to (M−1)UI with respect to the control signal $C_1$. Specifically, for example, it has been described above that, in the generator 2 of FIG. 4 at the time when M=3, an output signal of the latch circuit L11 is the control signal $C_1$, an output signal of the latch circuit L12 is the control signal $C_2$, and an output signal of the gate circuit G11 is the control signal $C_3$. However, any of these output signals may be set as the control signal $C_1$. The control signal $C_2$ may be selected so as to be a signal that is delayed by 1 UI with respect to the control signal $C_1$. The control signal $C_3$ may be selected so as to be a signal that is delayed by 2 UI with respect to the control signal $C_1$.

In the generator 2 of FIG. 6 at the time when M=6, the clock CLK2 and the clock CLK3 are 2-phase clocks, and a rising timing of one of the clock CLK2 and the clock CLK3 is identical to a falling timing of the other of the clock CLK2 and the clock CLK3. Accordingly, the generator (of FIG. 6) 2 may be configured to generate the clock CLK2 or the clock CLK3 by using the 2-division circuit 3 and to latch a value of an input signal at a rising timing and a falling timing of the generated clock by using the latch circuits L31 to L35. Specifically, the latch circuit L31 and the latch circuit L33 may be configured to latch a value of an input signal at one of a rising timing and a falling timing of the generated clock, and the latch circuit L32, the latch circuit L34, and the latch circuit L35 may be configured to latch the value of the input signal at the other of the rising timing and the falling timing.

The generator 2 illustrated in FIG. 6 may have, for example, a configuration in which the clock CLK2 and the clock CLK3 are inputted from the outside. The generator 2 may have a configuration in which the clock CLK2 or the clock CLK 3 is inputted from the outside and a logic inversion signal of the input clock is generated. Further, the generator 2 may have a configuration in which the clock CLK2 or the clock CLK3 is inputted from the outside and a value of an input signal is latched at a rising timing and a falling timing of the input clock.

Exemplary configurations of the m-th pre-stage buffer $B_m$ of the M buffers $B_1$ to $B_M$ are described next with reference to FIGS. 7 to 11.

Figure 7:
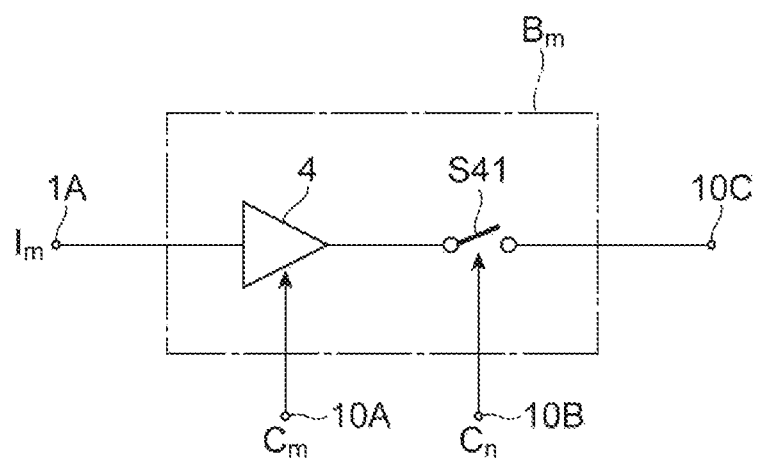
FIG. 7 illustrates a first exemplary configuration of a pre-stage buffer $B_m$.

FIG. 7 illustrates a first exemplary configuration of the pre-stage buffer $B_m$. The pre-stage buffer $B_m$ having the first exemplary configuration includes a tri-state buffer 4 and a switch S41. The tri-state buffer 4 includes an input end 1A that captures the input signal $I_m$, input ends 10A and 10B that respectively capture the control signals $C_m$ and $C_n$, and an output end 10C that outputs the input signal $I_m$. The tri-state buffer 4 receives the input signal $I_m$ and the control signal $C_m$ that have been captured via the input end 1A and the input end 10A, respectively. When the signal level of the control signal $C_m$ is significant, the tri-state buffer 4 outputs a signal that corresponds to the input signal $I_m$. On the other hand, when the signal level of the control signal $C_m$ is non-significant, the tri-state buffer 4 enters into a high-impedance output state. The switch S41 is provided between an output end of the tri-state buffer 4 and an input end of the output buffer $B_{out}$, and includes a first end that is electrically connected to the output end of the tri-state buffer 4, and a second end that is electrically connected to the input end of the output buffer $B_{out}$. In this configuration, the switch S41 changes a state of electrical connection between the first end and the second end in accordance with the signal level of the control signal $C_n$. Specifically, when the signal level of the control signal $C_n$ is significant, the switch S41 electrically connects the first end and the second end (the ON state). When the signal level of the control signal $C_n$ is non-significant, the switch S41 electrically disconnects the first end and the second end (the OFF state).

Figure 8:
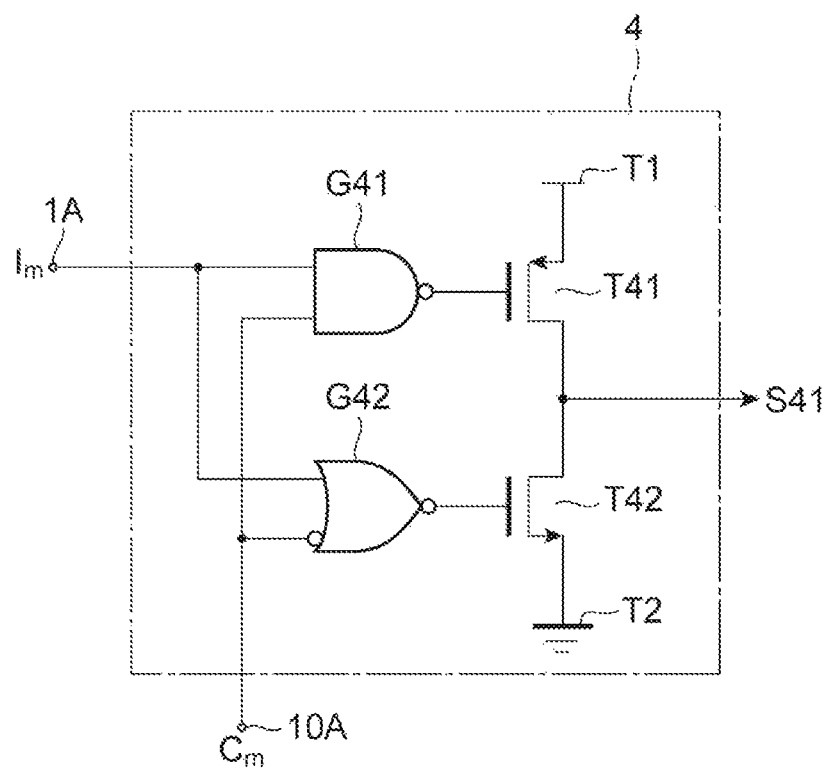
FIG. 8 illustrates an exemplary configuration of a tri-state buffer 4 in the pre-stage buffer $B_m$ having the first exemplary configuration.

The tri-state buffer 4 may have an arbitrary configuration, and the tri-state buffer 4 can have, for example, the exemplary configuration illustrated in FIG. 8. FIG. 8 illustrates an exemplary configuration of the tri-state buffer 4 in the first exemplary configuration of the pre-stage buffer $B_m$. The tri-state buffer 4 includes a first gate circuit G41, a second gate circuit G42, and a first-configuration series circuit that is disposed between a first reference end T1 and a second reference end T2. The first reference end T1 is set to have a first reference potential, and the second reference end T2 is set to have a second reference potential that is lower than the first reference potential. The first-configuration series circuit is configured by a PMOS transistor T41 and an NMOS transistor T42 that are disposed in order from a side of the first reference end T1 to a side of the second reference end T2, and a drain of the PMOS transistor T41 and a drain of the NMOS transistor T42 are connected to each other. The first gate circuit G41 receives the input signal $I_m$ and the control signal $C_m$, and outputs a signal indicating an NAND of these signals. The second gate circuit G42 receives the input signal $I_m$ and a logic inversion signal of the control signal $C_m$, and outputs a signal indicating an NOR of these signals.

The PMOS transistor T41 includes a source that is electrically connected to the first reference end T1, a gate that is connected to an output end of the first gate circuit G41, and the drain that is electrically connected to the drain of the NMOS transistor T42. The NMOS transistor T42 includes the drain that is electrically connected to the drain of the PMOS transistor T41, a gate that is electrically connected to an output end of the second gate circuit G42, and a source that is electrically connected to the second reference end T2. Further, a connection point of the drain of the PMOS transistor T41 and the drain of the NMOS transistor T42 is electrically connected to the switch S41.

Figure 9:
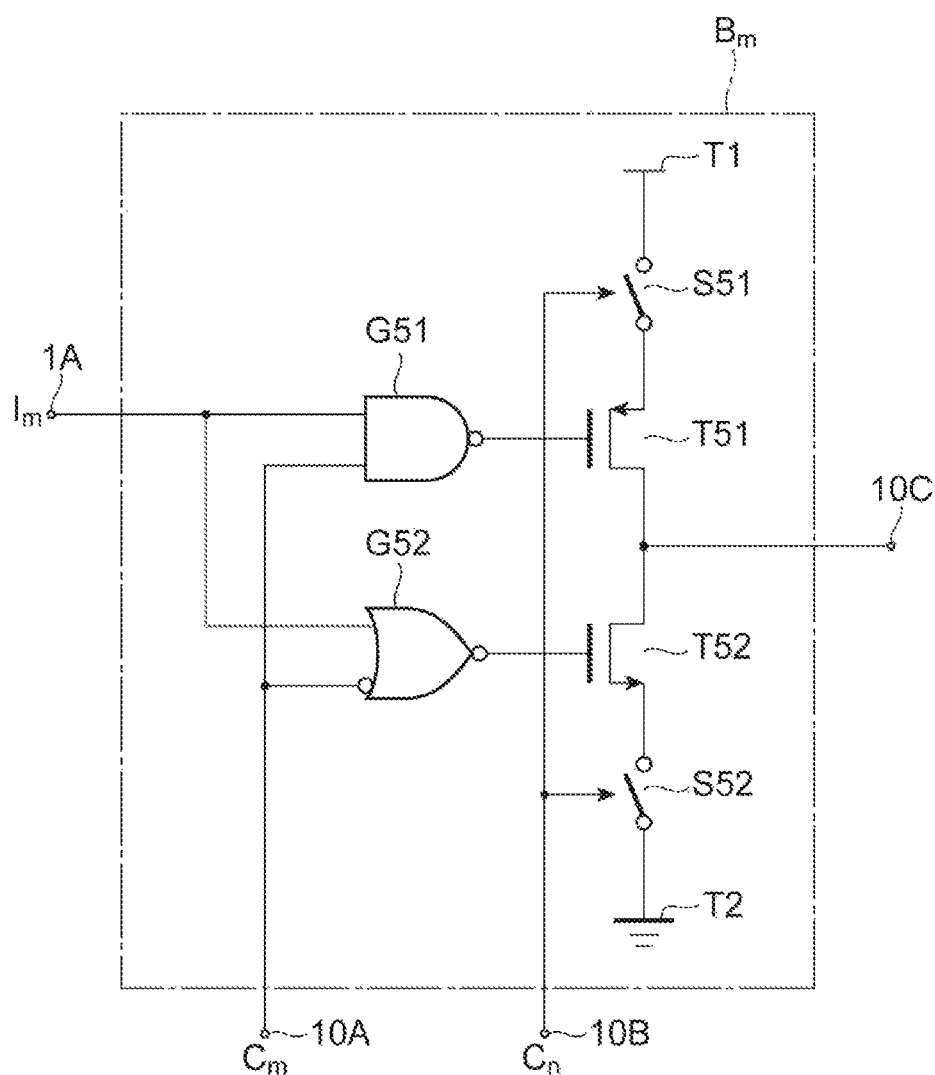
FIG. 9 illustrates a second exemplary configuration of the pre-stage buffer $B_m$.

FIG. 9 illustrates a second exemplary configuration of the pre-stage buffer $B_m$. The pre-stage buffer $B_m$ having the second exemplary configuration similarly includes an input end 1A that captures the input signal $I_m$, input ends 10A and 10B that respectively capture the control signals $C_m$ and $C_n$, and an output end 10C that outputs the input signal $I_m$. The pre-stage buffer $B_m$ having the second exemplary configuration includes a first gate circuit G51, a second gate circuit G52, and a second-configuration series circuit that is disposed between a first reference end T1 and a second reference end T2. The second-configuration series circuit is configured by a first buffer switch (hereinafter simply referred to as a "first switch") S51, a PMOS transistor T51, an NMOS transistor T52, and a second buffer switch (hereinafter simply referred to as a "second switch") S52 that are disposed in order from a side of the first reference end T1 to a side of the second reference end T2. The first gate circuit G51 receives the input signal $I_m$ and the control signal $C_m$, and outputs a signal indicating an NAND of these signals. The second gate circuit G52 receives the input signal $I_m$ and a logic inversion signal of the control signal $C_m$, and outputs a signal indicating an NOR of these signals.

The first switch S51 includes a first end that is electrically connected to the first reference end T1, and a second end that is electrically connected to a source of the PMOS transistor T51. In addition, the first switch S51 changes a state of electrical connection between the first end and the second end of the first switch S51 in accordance with the signal level of the control signal $C_n$. Stated another way, when the signal level of the control signal $C_n$ is significant, the first switch S51 electrically connects the first end and the second end (the ON state). When the signal level of the control signal $C_n$ is non-significant, the first switch S51 electrically disconnects the first end and the second end (the OFF state). The PMOS transistor T51 includes a source that is electrically connected to the second end of the first switch S51, a gate that is connected to an output end of the first gate circuit G51, and a drain that is electrically connected to a drain of the NMOS transistor T52. The NMOS transistor T52 includes the drain that is connected to the drain of the PMOS transistor T51, a gate that is electrically connected to an output end of the second gate circuit G52, and a source that is electrically connected to a first end of the second switch S52. The second switch S52 includes a first end that is electrically connected to the source of the NMOS transistor T52, and a second end that is electrically connected to the second reference end T2. In addition, the second switch S52 changes a state of electrical connection between the first end and the second end of the second switch S52 in accordance with the signal level of the control signal $C_n$. Stated another way, when the signal level of the control signal $C_n$ is significant, the second switch S52 electrically connects the first end and the second end (the ON state). When the signal level of the control signal $C_n$ is non-significant, the second switch S52 electrically disconnects the first end and the second end (the OFF state). Further, a connection point of the drain of the PMOS transistor T51 and the drain of the NMOS transistor T52 is connected to the input end of the output buffer $B_{out}$.

Figure 10:
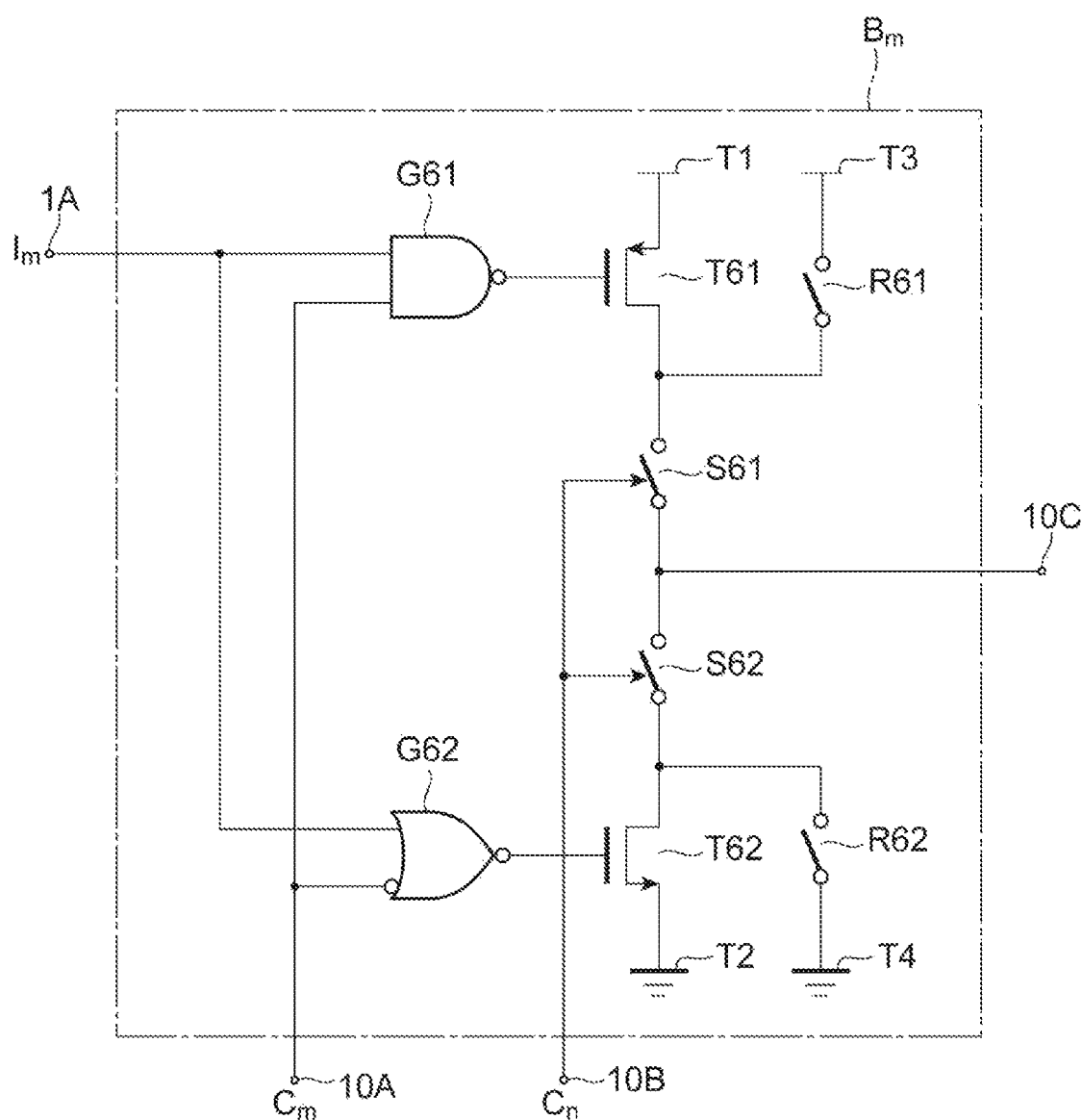
FIG. 10 illustrates a third exemplary configuration of the pre-stage buffer $B_m$.

FIG. 10 illustrates a third exemplary configuration of the pre-stage buffer $B_m$. The pre-stage buffer $B_m$ having the third exemplary configuration similarly includes an input end 1A that captures the input signal $I_m$, input ends 10A and 10B that respectively capture the control signals $C_m$ and $C_n$, and an output end 10C that outputs the input signal $I_m$. The pre-stage buffer $B_m$ having the third exemplary configuration includes a first gate circuit G61, a second gate circuit G62, and a third-configuration series circuit that is disposed between a first reference end T1 and a second reference end T2. The third-configuration series circuit is configured by a PMOS transistor T61, a first switch S61, a second switch S62, and an NMOS transistor T62 that are disposed in order from a side of the first reference end T1 to a side of the second reference end T2. The pre-stage buffer $B_m$ having the third exemplary configuration further includes a first refresh circuit R61 that refreshes a potential at a connection point of a drain of the PMOS transistor T61 and a first end of the first switch S61, and a second refresh circuit R62 that refreshes a potential at a connection point of a drain of the NMOS transistor T62 and a second end of the second switch S62. The first gate circuit G61 receives the input signal $I_m$ and the control signal $C_m$, and outputs a signal indicating an NAND of these signals. The second gate circuit G62 receives the input signal $I_m$ and a logic inversion signal of the control signal $C_m$, and outputs a signal indicating an NOR of these signals.

The PMOS transistor T61 includes a source that is electrically connected to the first reference end T1, a gate that is electrically connected to an output end of the first gate circuit G61, and the drain that is electrically connected to the first end of the first switch S61. The first switch S61 includes the first end that is electrically connected to the drain of the PMOS transistor T61, and a second end that is electrically connected to a first end of the second switch S62. In addition, the first switch S61 changes a state of electrical connection between the first end and the second end of the first switch S61 in accordance with the signal level of the control signal $C_n$. Specifically, when the signal level of the control signal $C_n$ is significant, the first switch S61 electrically connects the first end and the second end (the ON state). When the signal level of the control signal $C_n$ is non-significant, the first switch S61 electrically disconnects the first end and the second end (the OFF state). The second switch S62 includes the first end that is electrically connected to the second end of the first switch S61, and the second end that is electrically connected to the drain of the NMOS transistor T62. In addition, the second switch S62 changes a state of electrical connection between the first end and the second end of the second switch S62 in accordance with the signal level of the control signal $C_n$. Specifically, when the signal level of the control signal $C_n$ is significant, the second switch S62 electrically connects the first end and the second end (the ON state). When the signal level of the control signal $C_n$ is non-significant, the second switch S62 electrically disconnects the first end and the second end (the OFF state). The NMOS transistor T62 includes the drain that is electrically connected to the second end of the second switch S62, a gate that is electrically connected to an output end of the second gate circuit G62, and a source that is electrically connected to the second reference end T2. Further, a connection point of the second end of the first switch S61 and the first end of the second switch S62 is electrically connected to the input end of the output buffer $B_{out}$.

The first refresh circuit R61 is provided in parallel to the PMOS transistor T61, and includes a first end that is electrically connected to a third reference end T3, and a second end that is electrically connected to the connection point of the drain of the PMOS transistor T61 and the first end of the first switch S61. The third reference end T3 is set to have a third reference potential that is higher than a second reference potential. The second refresh circuit R62 is provided in parallel to the NMOS transistor T62, and includes a first end that is electrically connected to the connection point of the drain of the NMOS transistor T62 and the second end of the second switch S62, and a second end that is electrically connected to a fourth reference end T4. The fourth reference end T4 is set to have a fourth reference potential that is lower than a first reference potential.

Figure 11:
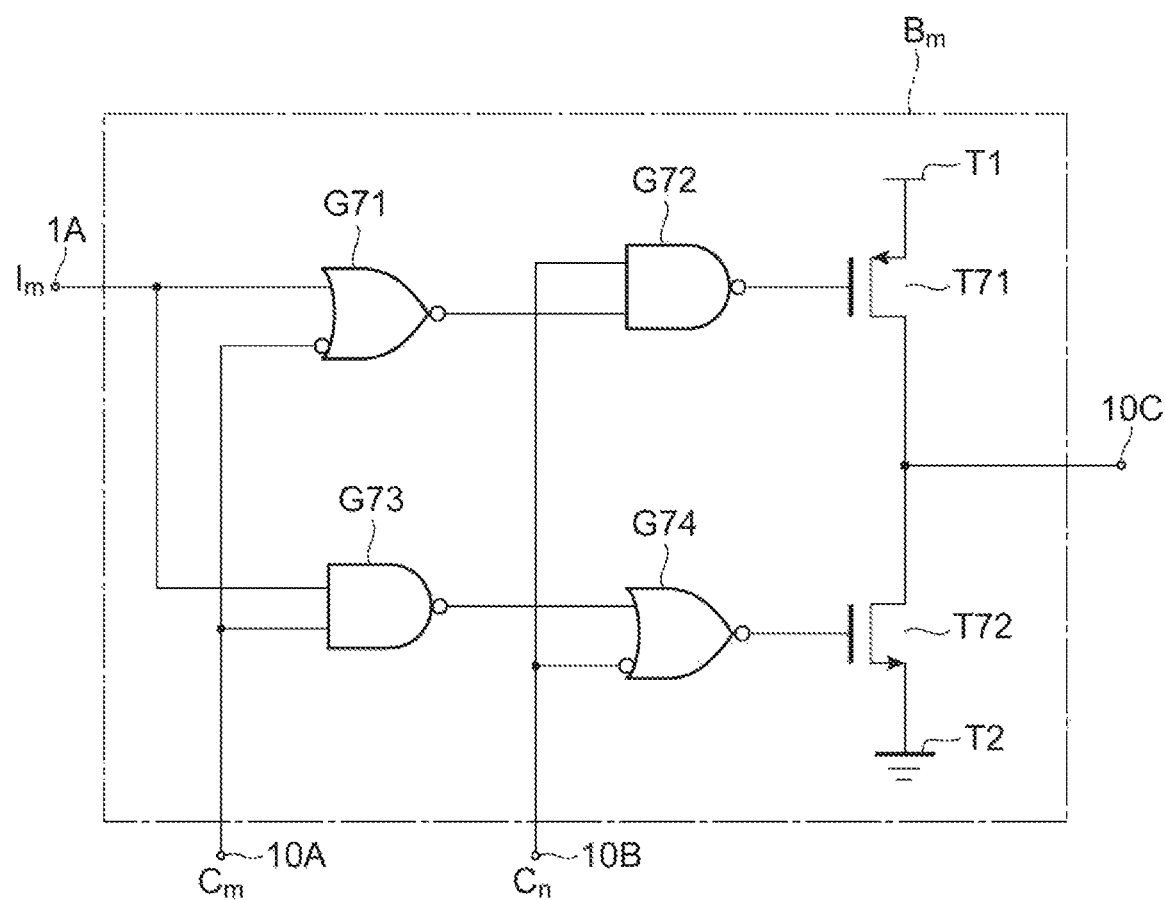
FIG. 11 illustrates a fourth exemplary configuration of the pre-stage buffer $B_m$.

FIG. 11 illustrates a fourth exemplary configuration of the pre-stage buffer $B_m$. The pre-stage buffer $B_m$ having the fourth exemplary configuration similarly includes an input end 1A that captures the input signal $I_m$, input ends 10A and LOB that respectively capture the control signals $C_m$ and $C_n$, and an output end 10C that outputs the input signal $I_m$. The pre-stage buffer $B_m$ having the fourth exemplary configuration includes first to fourth gate circuits G71 to G74, and a fourth-configuration series circuit that is disposed between a first reference end T1 and a second reference end T2. The fourth-configuration series circuit is configured by a PMOS transistor T71 and an NMOS transistor T72 that are disposed in order from a side of the first reference end to a side of the second reference end, and a drain of the PMOS transistor T71 and a drain of the NMOS transistor T72 are connected to each other. The first gate circuit G71 receives the input signal $I_m$ and a logic inversion signal of the control signal $C_m$, and outputs a signal indicating an NOR of these signals. The second gate circuit G72 receives an output signal of the first gate circuit G71 and the control signal $C_n$, and outputs a signal indicating an NAND of these signals. The third gate circuit G73 receives the input signal $I_m$ and the control signal $C_m$, and outputs a signal indicating an NAND of these signals. The fourth gate circuit G74 receives an output signal of the third gate circuit G73 and a logic inversion signal of the control signal $C_n$, and outputs a signal indicating an NOR of these signals.

The PMOS transistor T71 includes a source that is electrically connected to the first reference end T1, a gate that is connected to an output end of the second gate circuit G72, and the drain that is electrically connected to the drain of the NMOS transistor T72. The NMOS transistor T72 includes the drain that is electrically connected to the drain of the PMOS transistor 171, a gate that is electrically connected to an output end of the fourth gate circuit G74, and a source that is electrically connected to the second reference end T2. A connection point of the drain of the PMOS transistor T71 and the drain of the NMOS transistor T72 is connected to the input end of the output buffer $B_{out}$.

In each of the exemplary configurations above of the pre-stage buffer $B_m$, each of the switch S41, the first switch S51, the second switch S52, the first switch S61, the second switch S62, the first refresh circuit R61, and the second refresh circuit R62 can be configured by a single MOS transistor, or can be configured by a transfer gate. Specifically, for example, in the exemplary configuration illustrated in FIG. 9 of the pre-stage buffer $B_m$, the first switch S51 can be configured by a PMOS transistor that receives the logic inversion signal of the control signal $C_n$, and the second switch S52 can be configured by an NMOS transistor that receives the control signal $C_n$.

In each of the exemplary configurations above of the pre-stage buffer $B_m$, any signal that has a logic inversion relationship with the control signal $C_m$ can be used as the logic inversion signal of the control signal $C_m$, and any signal that has a logic inversion relationship with the control signal $C_n$ can be used as the logic inversion signal of the control signal $C_n$. An arbitrary method for generating the logic inversion signal of the control signal $C_m$ and the logic inversion signal of the control signal $C_n$ can be used.

The pre-stage buffer $B_m$ does not need to employ a configuration in which two switches are connected in series. Therefore, a parasitic resistance value and a parasitic capacitance value due to a switch are reduced such that the waveform of an output signal can be prevented from being blunted, and this enables a frequency band to be expanded. Accordingly, the signal-multiplexing device 1 according to the present embodiment is capable of satisfactorily handling an increase in a data rate. The signal-multiplexing device 1 is also capable of mitigating what is called a charge sharing effect. The charge sharing effect is a phenomenon in which a buffer in the high-impedance output state includes a switch in the ON state, and a parasitic capacitance is charged or discharged via the switch such that the waveform of an output signal is blunted.

When the first to fourth exemplary configurations of the pre-stage buffer $B_m$ are compared with each other, two gate circuits are driven in the first to third exemplary configurations, and four gate circuits are driven in the fourth exemplary configuration. Therefore, in the first to third exemplary configurations, a driving load can be reduced in comparison with the fourth exemplary configuration. In contrast, the fourth exemplary configuration does not include a switch. Therefore, the fourth exemplary configuration is capable of satisfactorily handling a further increase in a data rate in comparison with the first to third exemplary configurations. In addition, the fourth exemplary configuration is capable of solving the charge sharing effect, whereas the first to third exemplary configurations only mitigate the charge sharing effect.

In the third exemplary configuration, if the first refresh circuit R61 and the second refresh circuit R62 are not provided, a potential at a connection point of the PMOS transistor T61 and the first switch S61 and a potential at a connection point of the NMOS transistor T62 and the second switch S62 depend on the previous level of an input signal, and the potentials may be unstable. Accordingly, in the third exemplary configuration, it is preferable that the first refresh circuit R61 and the second refresh circuit R62 be provided. The first exemplary configuration, the second exemplary configuration, and the fourth exemplary configuration do not have a problem of dependency on an input signal pattern, and therefore refresh circuits can be omitted.

The present invention is not limited to the embodiment described above, and various variations can be made. For example, the circuit configuration of each of the pre-stage buffers $B_1$ to $B_M$ and the output buffer $B_{out}$ is not limited to the exemplary configurations described above, and various configurations can be employed.

REFERENCE SIGNS LIST

1 . . . Signal-multiplexing device; 2 . . . Generator, 4 . . . Tri-state buffer; $B_1$ to $B_M$, $B_m$ . . . Pre-stage buffer; $B_{out}$ . . . Output buffer; $C_1$ to $C_M$, $C_m$, $C_n$ . . . Control signal; CLK1 to CLK3 . . . Clock; G31 to G34 . . . Gate circuit; G41, G51, G61, G71 . . . First gate circuit; G42, G52, G62, G72 . . . Second gate circuit; G73 . . . Third gate circuit; G74 . . . Fourth gate circuit; $I_1$ to $I_M$, $I_m$ . . . Input signal; L31 to L35 . . . Latch circuit; S41 . . . Switch; S51, S61 . . . First switch; S52, S62 . . . Second switch; T41, T51, T61, T71 . . . PMOS transistor; T42, T52, T62, T72 . . . NMOS transistor; R61 . . . First refresh circuit; R62 . . . Second refresh circuit; T1 . . . First reference end; T2 . . . Second reference end; T3 . . . Third reference end; and T4 . . . Fourth reference end.

The invention claimed is:

1. A signal-multiplexing device that outputs an input signal $I_m$ of M input signals $I_1$ to $I_m$ (M is an integer of 3 or more) during a prescribed period, the input signal $I_m$ being sequentially specified by a combination of signal levels of at least a control signal $C_m$ and a control signal C selected from M control signals $C_1$ to $C_M$, the control signal $C_m$ being an m-th control signal (m is an integer that is greater than or equal to 1 and is smaller than or equal to M), the control signal C being an n-th control signal (n is 1 when m=M, and n is an integer of m+1 when m<M), the prescribed period being a period during which the combination of the signal levels is maintained, the signal-multiplexing device comprising:

M pre-stage buffers $B_1$ to $B_M$ configured to be provided so as to respectively correspond to the M input signals $I_1$ to $I_m$, a pre-stage buffer $B_m$ having an output end, a first input end for inputting the input signal Im, a second input end for inputting the control signal Cm, and a third input end for inputting the control signal Cn, the pre-stage buffer Bm being an m-th pre-stage buffer of the M pre-stage buffers $B_1$ to $B_M$, the pre-stage buffer $B_m$ outputting the input signal $I_m$ that has been inputted to the pre-stage buffer $B_m$ when signal levels of both the control signal $C_m$ and the control signal C are significant, the pre-stage buffer $B_m$ entering into a high-impedance output state when a signal level of at least one of the control signal $C_m$ and the control signal $C_n$ is non-significant; and an output buffer $B_{out}$ having an input end electrically connected to the output end of each of the M pre-stage buffers $B_1$ to $B_M$ and an output end for sequentially outputting the M input signals $I_1$ to $I_m$ that have been respectively outputted from the M pre-stage buffers $B_1$ to $B_M$ at different timings.

2. The signal-multiplexing device according to claim 1, wherein the pre-stage buffer $B_m$ includes:

a first gate circuit configured to output a signal indicating a negative AND (NAND) of the input signal $I_m$ and the control signal $C_m$;

a second gate circuit configured to output a signal indicating a negative OR (NOR) of the input signal $I_m$ and a logic inversion signal of the control signal $C_m$; and a circuit configured to be disposed between a first reference end and a second reference end, the first reference end being set to have a first reference potential, the second reference end being set to have a second reference potential that is lower than the first reference potential, the circuit being configured by a first buffer switch, a PMOS transistor, an NMOS transistor, and a second buffer switch, the first buffer switch includes a first end configured to be electrically connected to the first reference end, and a second end configured to be electrically connected to a source of the PMOS transistor, and the first buffer switch changes a state of electrical connection between the first end and the second end of the first buffer switch in accordance with a signal level of the control signal $C_n$, the PMOS transistor includes the source configured to be electrically connected to the second end of the first buffer switch, a gate configured to be connected to an output end of the first gate circuit, and a drain configured to be electrically connected to a drain of the NMOS transistor, the NMOS transistor includes the drain configured to be connected to the drain of the PMOS transistor, a gate configured to be electrically connected to an output end of the second gate circuit, and a source configured to be electrically connected to a first end of the second buffer switch, the second buffer switch includes the first end configured to be electrically connected to the source of the NMOS transistor, and a second end configured to be electrically connected to the second reference end, and the second buffer switch changes a state of electrical connection between the first end and the second end of the second buffer switch in accordance with the signal level of the control signal $C_n$, and a connection point of the drain of the PMOS transistor and the drain of the NMOS transistor is connected to an input end of the output buffer $B_{out}$.

3. The signal-multiplexing device according to claim 2, further comprising:

a generator configured to generate each of the M control signals $C_1$ to $C_M$.

4. The signal-multiplexing device according to claim 3, wherein as a structure that generates control signals $C_1$ to $C_6$ that correspond to the M control signals $C_1$ to $C_M$, the generator includes first to fifth latch circuits and fifth to eighth gate circuits, the first latch circuit receives an output signal of the seventh gate circuit, latches a value of the output signal of the seventh gate circuit at one timing of a rising timing or a falling timing of a clock, and outputs the value that has been latched, the fifth gate circuit outputs a logic inversion signal of an output signal of the first latch circuit as the control signal $C_3$, the second latch circuit receives the control signal $C_3$, latches a value of the control signal $C_3$ at the other timing of the rising timing or the falling timing of the clock, and outputs the value that has been latched as the control signal $C_4$, the third latch circuit receives the output signal of the first latch circuit, latches a value of the output signal of the first latch circuit at the one timing, and outputs the value that has been latched, the sixth gate circuit outputs a logic inversion signal of an output signal of the third latch circuit as the control signal $C_5$, the fourth latch circuit latches a value of the control signal $C_5$ that has been outputted from the sixth gate circuit at the other timing, and outputs the value that has been latched as the control signal $C_6$, the seventh gate circuit outputs a signal indicating an NAND of the output signal of the first latch circuit and the output signal of the third latch circuit, the eighth gate circuit outputs a logic inversion signal of an output signal of the seventh gate circuit as the control signal $C_1$, and the fifth latch circuit latches a value of the control signal $C_1$ that has been outputted from the eighth gate circuit at the other timing, and outputs the value that has been latched as the control signal $C_2$.

5. The signal-multiplexing device according to claim 1, wherein the pre-stage buffer $B_m$ includes:

a first gate circuit configured to output a signal indicating a negative AND (NAND) of the input signal $I_m$ and the control signal $C_m$;

a second gate circuit configured to output a signal indicating a negative OR (NOR) of the input signal $I_m$ and a logic inversion signal of the control signal $C_m$; and a circuit configured to be disposed between a first reference end and a second reference end, the first reference end being set to have a first reference potential, the second reference end being set to have a second reference potential that is lower than the first reference potential, the circuit being configured by a PMOS transistor, a first buffer switch, a second buffer switch, and an NMOS transistor, the PMOS transistor includes a source configured to be electrically connected to the first reference end, a gate configured to be electrically connected to an output end of the first gate circuit, and a drain configured to be electrically connected to a first end of the first buffer switch, the first buffer switch includes the first end configured to be electrically connected to the drain of the PMOS transistor, and a second end configured to be electrically connected to a first end of the second buffer switch, and the first buffer switch changes a state of electrical connection between the first end and the second end of the first buffer switch in accordance with a signal level of the control signal $C_n$, the second buffer switch includes the first end configured to be electrically connected to the second end of the first buffer switch, and a second end configured to be electrically connected to a drain of the NMOS transistor, and the second buffer switch changes a state of electrical connection between the first end and the second end of the second buffer switch in accordance with the signal level of the control signal $C_n$, the NMOS transistor includes the drain configured to be electrically connected to the second end of the second buffer switch, a gate configured to be electrically connected to an output end of the second gate circuit, and a source configured to be electrically connected to the second reference end, and a connection point of the second end of the first buffer switch and the first end of the second buffer switch is electrically connected to an input end of the output buffer $B_{out}$.

6. The signal-multiplexing device according to claim 5, wherein the pre-stage buffer $B_m$ further includes:

a first refresh circuit configured to include a first end electrically connected to a third reference end, and a second end electrically connected to a connection point of the drain of the PMOS transistor and the first end of the first buffer switch, the third reference end being set to have a third reference potential that is higher than the second reference potential, the first refresh circuit refreshing a potential at the connection point of the drain of the PMOS transistor and the first end of the first buffer switch; and a second refresh circuit configured to include a first end electrically connected to a connection point of the drain of the NMOS transistor and the second end of the second buffer switch, and a second end electrically connected to a fourth reference end, the fourth reference end being set to have a fourth reference potential that is lower than the first reference potential, the second refresh circuit refreshing a potential at the connection point of the drain of the NMOS transistor and the second end of the second buffer switch.

7. The signal-multiplexing device according to claim 5, further comprising:
a generator configured to generate each of the M control signals $C_1$ to $C_M$.

8. The signal-multiplexing device according to claim 7, wherein
as a structure that generates control signals $C_1$ to $C_6$ that correspond to the M control signals $C_1$ to $C_M$, the generator includes first to fifth latch circuits and fifth to eighth gate circuits,
the first latch circuit receives an output signal of the seventh gate circuit, latches a value of the output signal of the seventh gate circuit at one timing of a rising timing or a falling timing of a clock, and outputs the value that has been latched,
the fifth gate circuit outputs a logic inversion signal of an output signal of the first latch circuit as the control signal $C_3$,
the second latch circuit receives the control signal $C_3$, latches a value of the control signal $C_3$ at the other timing of the rising timing or the falling timing of the clock, and outputs the value that has been latched as the control signal $C_4$,
the third latch circuit receives the output signal of the first latch circuit, latches a value of the output signal of the first latch circuit at the one timing, and outputs the value that has been latched,
the sixth gate circuit outputs a logic inversion signal of an output signal of the third latch circuit as the control signal $C_5$,
the fourth latch circuit latches a value of the control signal $C_5$ that has been outputted from the sixth gate circuit at the other timing, and outputs the value that has been latched as the control signal $C_6$,
the seventh gate circuit outputs a signal indicating an NAND of the output signal of the first latch circuit and the output signal of the third latch circuit,
the eighth gate circuit outputs a logic inversion signal of an output signal of the seventh gate circuit as the control signal $C_1$, and
the fifth latch circuit latches a value of the control signal $C_1$ that has been outputted from the eighth gate circuit at the other timing, and outputs the value that has been latched as the control signal $C_2$.

9. The signal-multiplexing device according to claim 1, wherein
the pre-stage buffer $B_m$ includes:
a first gate circuit configured to output a signal indicating a negative OR (NOR) of the input signal $I_m$ and a logic inversion signal of the control signal $C_m$;
a second gate circuit configured to output a signal indicating a negative AND (NAND) of an output signal of the first gate circuit and the control signal $C_n$;
a third gate circuit configured to output a signal indicating an NAND of the input signal $I_m$ and the control signal $C_m$;
a fourth gate circuit configured to output a signal indicating an NOR of an output signal of the third gate circuit and a logic inversion signal of the control signal $C_n$; and
a circuit configured to be disposed between a first reference end and a second reference end, the first reference end being set to have a first reference potential, the second reference end being set to have a second reference potential that is lower than the first reference potential, the circuit being configured by a PMOS transistor and an NMOS transistor, a drain of the PMOS transistor being connected to a drain of the NMOS transistor,
the PMOS transistor includes a source configured to be electrically connected to the first reference end, a gate configured to be connected to an output end of the second gate circuit, and the drain configured to be electrically connected to the drain of the NMOS transistor, and
the NMOS transistor includes the drain configured to be electrically connected to the drain of the PMOS transistor, a gate configured to be electrically connected to an output end of the fourth gate circuit, and a source configured to be electrically connected to the second reference end.

10. The signal-multiplexing device according to claim 9, further comprising:
a generator configured to generate each of the M control signals $C_1$ to $C_M$.

11. The signal-multiplexing device according to claim 10, wherein
as a structure that generates control signals $C_1$ to $C_6$ that correspond to the M control signals $C_1$ to $C_M$, the generator includes first to fifth latch circuits and fifth to eighth gate circuits,
the first latch circuit receives an output signal of the seventh gate circuit, latches a value of the output signal of the seventh gate circuit at one timing of a rising timing or a falling timing of a clock, and outputs the value that has been latched,
the fifth gate circuit outputs a logic inversion signal of an output signal of the first latch circuit as the control signal $C_3$,
the second latch circuit receives the control signal $C_3$, latches a value of the control signal $C_3$ at the other timing of the rising timing or the falling timing of the clock, and outputs the value that has been latched as the control signal $C_4$,
the third latch circuit receives the output signal of the first latch circuit, latches a value of the output signal of the first latch circuit at the one timing, and outputs the value that has been latched,
the sixth gate circuit outputs a logic inversion signal of an output signal of the third latch circuit as the control signal $C_5$,
the fourth latch circuit latches a value of the control signal $C_5$ that has been outputted from the sixth gate circuit at the other timing, and outputs the value that has been latched as the control signal $C_6$,
the seventh gate circuit outputs a signal indicating an NAND of the output signal of the first latch circuit and the output signal of the third latch circuit,
the eighth gate circuit outputs a logic inversion signal of an output signal of the seventh gate circuit as the control signal $C_1$, and
the fifth latch circuit latches a value of the control signal $C_1$ that has been outputted from the eighth gate circuit at the other timing, and outputs the value that has been latched as the control signal $C_2$.

12. The signal-multiplexing device according to claim 1, wherein
the pre-stage buffer $B_m$ includes:
a tri-state buffer configured to output the input signal $I_m$ that has been temporarily captured when a signal level of the control signal $C_m$ is significant, and to enter into the high-impedance output state when the signal level of the control signal $C_m$ is non-significant; and a switch configured to include a first end electrically connected to an output end of the tri-state buffer, and a second end electrically connected to an input end of the output buffer $B_{out}$, the switch changing a state of electrical connection between the first end and the second end in accordance with a signal level of the control signal $C_n$.

13. The signal-multiplexing device according to claim 12, wherein
the tri-state buffer includes:
a first gate circuit configured to output a signal indicating a negative AND (NAND) of the input signal $I_m$ and the control signal $C_m$;
a second gate circuit configured to output a signal indicating a negative OR (NOR) of the input signal $I_m$ and a logic inversion signal of the control signal $C_m$; and
a circuit configured to be disposed between a first reference end and a second reference end, the first reference end being set to have a first reference potential, the second reference end being set to have a second reference potential that is lower than the first reference potential, the circuit being configured by a PMOS transistor and an NMOS transistor, a drain of the PMOS transistor being connected to a drain of the NMOS transistor,
the PMOS transistor includes a source configured to be electrically connected to the first reference end, a gate configured to be connected to an output end of the first gate circuit, and the drain configured to be electrically connected to the drain of the NMOS transistor,
the NMOS transistor includes the drain configured to be electrically connected to the drain of the PMOS transistor, a gate configured to be electrically connected to an output end of the second gate circuit, and a source configured to be electrically connected to the second reference end, and
a connection point of the drain of the PMOS transistor and the drain of the NMOS transistor is electrically connected to the first end of the switch.

14. The signal-multiplexing device according to claim 12, further comprising:
a generator configured to generate each of the M control signals $C_1$ to $C_M$.

15. The signal-multiplexing device according to claim 14, wherein
as a structure that generates control signals $C_1$ to $C_6$ that correspond to the M control signals $C_1$ to $C_M$, the generator includes first to fifth latch circuits and fifth to eighth gate circuits,
the first latch circuit receives an output signal of the seventh gate circuit, latches a value of the output signal of the seventh gate circuit at one timing of a rising timing or a falling timing of a clock, and outputs the value that has been latched,
the fifth gate circuit outputs a logic inversion signal of an output signal of the first latch circuit as the control signal $C_3$,
the second latch circuit receives the control signal $C_3$, latches a value of the control signal $C_3$ at the other timing of the rising timing or the falling timing of the clock, and outputs the value that has been latched as the control signal $C_4$,
the third latch circuit receives the output signal of the first latch circuit, latches a value of the output signal of the first latch circuit at the one timing, and outputs the value that has been latched,
the sixth gate circuit outputs a logic inversion signal of an output signal of the third latch circuit as the control signal $C_5$,
the fourth latch circuit latches a value of the control signal $C_5$ that has been outputted from the sixth gate circuit at the other timing, and outputs the value that has been latched as the control signal $C_6$,
the seventh gate circuit outputs a signal indicating an NAND of the output signal of the first latch circuit and the output signal of the third latch circuit,
the eighth gate circuit outputs a logic inversion signal of an output signal of the seventh gate circuit as the control signal $C_1$, and
the fifth latch circuit latches a value of the control signal $C_1$ that has been outputted from the eighth gate circuit at the other timing, and outputs the value that has been latched as the control signal $C_2$.

* * * * *